(12) United States Patent
Wang et al.

(10) Patent No.: US 10,254,374 B2
(45) Date of Patent: Apr. 9, 2019

(54) METHOD OF CURRENT SENSOR RELATED TORQUE ERROR ESTIMATION FOR IPMSM E-DRIVE SYSTEM

(71) Applicant: Ford Global Technologies, LLC, Dearborn, MI (US)

(72) Inventors: Chang-jiang Wang, Troy, MI (US); Michael Degner, Novi, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 1262 days.

(21) Appl. No.: 13/942,838

(22) Filed: Jul. 16, 2013

(65) Prior Publication Data

US 2015/0025828 A1 Jan. 22, 2015

(51) Int. Cl.
| | |
|---|---|
| *H02P 31/00* | (2006.01) |
| *G05D 17/00* | (2006.01) |
| *B60L 3/12* | (2006.01) |
| *G05B 15/02* | (2006.01) |
| *G01D 21/00* | (2006.01) |
| *G06F 17/40* | (2006.01) |
| *G06F 19/00* | (2011.01) |
| *G01R 35/00* | (2006.01) |

(Continued)

(52) U.S. Cl.
CPC ............ *G01R 35/00* (2013.01); *B60L 3/0038* (2013.01); *B60L 3/0061* (2013.01); *B60L 3/12* (2013.01); *H02P 21/20* (2016.02); *H02P 31/00* (2013.01); *B60L 2240/423* (2013.01); *B60L 2240/429* (2013.01); *G01D 21/00* (2013.01); *G05B 15/02* (2013.01); *G05D 17/00* (2013.01); *G06F 17/40* (2013.01); *G06F 19/00* (2013.01); *Y02T 10/643* (2013.01); *Y02T 10/7258* (2013.01)

(58) Field of Classification Search
None
See application file for complete search history.

(56) References Cited

U.S. PATENT DOCUMENTS 4,967,135 A * 10/1990 Ashikaga ................ H02P 21/09
                                                                           318/798
5,226,390 A * 7/1993 Nakagawa ............ F02D 35/023
                                                                           123/436

(Continued)

FOREIGN PATENT DOCUMENTS

| CN | 104290611 A | * | 1/2015 |
| DE | 10 2014 212 964 A1 | * | 1/2015 |
| JP | 11-248568 A | * | 9/1999 |

*Primary Examiner* — Mohamed Charioui
*Assistant Examiner* — Catherine T. Rastovski
(74) *Attorney, Agent, or Firm* — David B. Kelley; MacMillan Sobanski & Todd, LLC

(57) ABSTRACT

A method for estimating torque control error at an electric machine considers the effects of current sensor error characteristics. Systems and methods can be practiced to determine the maximum sensor error that can be tolerated without causing unacceptable torque error. An example method uses sensor characteristics and machine characteristics to determine current sensing error, current control error, and torque control error. Determining the lowest sensor accuracy required for a desired torque control accuracy can facilitate the use of lower cost sensors in current-feedback controlled electric drive systems without compromising performance. Other applications can include vehicle diagnostics and torque error compensation.

15 Claims, 5 Drawing Sheets

(51) Int. Cl.
*B60L 3/00* (2019.01)
*H02P 21/20* (2016.01)

(56) References Cited

U.S. PATENT DOCUMENTS

| | | | | |
|---|---|---|---|---|
| 5,309,075 A * | 5/1994 | Yokoe | H02P 21/22 | 318/608 |
| 5,319,294 A * | 6/1994 | Ohto | G05B 19/237 | 318/568.22 |
| 5,577,474 A * | 11/1996 | Livshiz | F02D 31/002 | 123/352 |
| 5,616,999 A * | 4/1997 | Matsumura | G05D 17/02 | 318/432 |
| 5,962,999 A * | 10/1999 | Nakamura | H02P 6/10 | 318/400.31 |
| 6,594,592 B1 * | 7/2003 | Griepentrog | H02P 21/12 | 702/189 |
| 6,781,333 B2 * | 8/2004 | Koide | H02P 21/00 | 318/432 |
| 7,095,209 B2 * | 8/2006 | Thunes | H02P 21/09 | 318/727 |
| 7,960,930 B2 | 6/2011 | Sato | | |
| 8,080,956 B2 | 12/2011 | Wu | | |
| 8,269,439 B2 * | 9/2012 | Itoh | H02M 7/00 | 318/400.02 |
| 8,653,768 B2 * | 2/2014 | Stulz | H02P 23/14 | 310/156.07 |
| 9,020,731 B2 * | 4/2015 | Yamada | B60L 15/025 | 318/400.04 |
| 9,369,080 B2 * | 6/2016 | Ahmad | H02P 23/14 | |
| 9,372,234 B2 * | 6/2016 | Wang | G01R 31/3191 | |
| 9,413,281 B2 * | 8/2016 | Nakai | H02P 29/0038 | |
| 9,425,722 B2 * | 8/2016 | Shouji | H02P 6/08 | |
| 2002/0180402 A1 * | 12/2002 | Koide | H02P 21/00 | 318/727 |
| 2006/0066275 A1 * | 3/2006 | Thunes | H02P 21/09 | 318/432 |
| 2007/0159131 A1 * | 7/2007 | Kitanaka | H02P 21/16 | 318/807 |
| 2009/0237013 A1 * | 9/2009 | Sato | B60L 15/025 | 318/400.02 |
| 2010/0013421 A1 * | 1/2010 | Itoh | H02M 7/00 | 318/400.09 |
| 2011/0031943 A1 * | 2/2011 | Green | H02M 1/4208 | 323/205 |
| 2012/0068640 A1 * | 3/2012 | Stulz | H02P 23/14 | 318/400.02 |
| 2012/0139460 A1 | 6/2012 | Senkou | | |
| 2012/0176068 A1 | 7/2012 | Tsuji | | |
| 2013/0038342 A1 | 2/2013 | Nozaki | | |
| 2013/0278184 A1 * | 10/2013 | Suzuki | H02P 21/14 | 318/400.02 |
| 2014/0018991 A1 * | 1/2014 | Yamada | B60L 15/025 | 701/22 |
| 2014/0361612 A1 * | 12/2014 | Magne | B60L 3/0023 | 307/10.1 |
| 2015/0061557 A1 * | 3/2015 | Shouji | H02P 6/08 | 318/400.15 |
| 2015/0061708 A1 * | 3/2015 | Wang | G01R 31/3191 | 324/750.02 |
| 2015/0180399 A1 * | 6/2015 | Ahmad | H02P 23/14 | 318/701 |
| 2015/0229247 A1 * | 8/2015 | Nakai | H02P 29/0038 | 318/400.02 |

* cited by examiner

METHOD OF CURRENT SENSOR RELATED TORQUE ERROR ESTIMATION FOR IPMSM E-DRIVE SYSTEM

FIELD OF INVENTION

This invention relates generally to torque error estimation for electric drive systems, and more particularly to methods for estimating the torque control error using current sensor errors.

BACKGROUND OF INVENTION

Electrified vehicles employ an electric drive system designed to provide emissions-free propulsion with reduced fuel consumption while also providing uncompromised vehicle performance. To produce a satisfying and enjoyable driving experience for an operator, the vehicle's electric drive system must reliably deliver required torque during all operating conditions. Various types of electric drive control methods can be employed to achieve this objective, including those that rely on some form of feedback. Current-feedback control systems use current sensors to provide feedback information regarding the current flow through the electric motor stator windings. Feedback can be provided to a torque control system configured to control current to the motor. When current sensors are accurate, proper drive signals can be provided and torque demand can be satisfied. However, errors at current sensors can generate current control errors that cause torque output to deviate from a command torque. While some degree of torque deviation can be tolerated without noticeable effect on performance, significant deviation can disturb electric drive operation.

Electric drive engineers are tasked to design systems having sufficient torque accuracy for satisfactory vehicle performance in all operational states. The torque accuracy required for satisfactory performance changes with torque levels and motor speed. For example, while 4% accuracy may be sufficient at torques below 50 Nm, a 7% accuracy may be required at torques above 50 Nm. While torque accuracy can depend on several factors, sensor accuracy is of particular importance in those systems using current feedback control techniques. In many cases, the need to produce vehicles that perform well at all speeds prompts an engineer to incorporate high accuracy sensors to minimize the probability that errors will occur. Current sensors can be expensive, with sensor price correlating directly with sensor accuracy. Over-specifying the sensor accuracy required for a system may unjustifiably increase system costs. Unfortunately, as of yet there is no systematic approach for determining a minimal sensor accuracy requirement for a desired torque accuracy. Sensors that fail to operate with sufficient accuracy adversely affect vehicle performance, while sensors that operate with overly high accuracy unnecessarily drive up costs.

While some prior art systems and methods have attempted to address various issues related to electric machine torque control, they have failed to isolate, determine, predict, compensate or utilize the effects of current sensing errors on estimated torque output.

SUMMARY OF THE INVENTION

A system of the invention can include a processor configured to cooperate with a torque error estimation module (TEEM) to estimate a torque control error caused by a current sensing error. In an example embodiment, a TEEM can comprise hardware, software, firmware or some combination thereof, and can include a machine characteristic submodule (MCS), a sensor characteristic submodule (SCS), a machine operational parameter submodule (MOPS), a sensing error determination submodule (SEDS), a current control error determination submodule (CCEDS), and a torque error determination submodule (TEDS).

A system of the invention can comprise a processor and a non-transitory computer readable medium having encoded thereon instructions for the processor that when executed by the processor cause the processor to estimate a torque error caused by a current sensing error. In an example embodiment, the instructions can cause the processor to use current sensor characteristics and machine characteristics in a torque error estimation. An example system can include a memory from which one or more sensor characteristics and/or machine characteristics and operational parameters can be retrieved.

A method for determining a torque control error caused by a current sensing error is presented. An example method can include determining a current sensing error using one or more current sensor characteristics, and using the current sensing error to estimate a torque error. By way of example, a current sensor characteristic can be in the form of a sensor gain or sensor offset. An example method can include determining a current control error using the current sensor error, and using the current control error to estimate a torque error. In an example embodiment, a method can comprise receiving one or more machine characteristics, receiving one or more current sensor characteristics, receiving one or more machine operational parameters, determining current sensor error, determining current control error, and estimating torque error. The resulting torque error can be used in a variety of ways, including but not limited to, sensor specification, electric drive system design, vehicle diagnostics, and torque error compensation.

DETAILED DESCRIPTION OF EXAMPLE EMBODIMENTS

As required, detailed embodiments of the present invention are disclosed herein. However, it is to be understood that the particular embodiments discussed are merely descriptive examples of the invention, which can be practiced in various and alternative embodiments. The figures are not necessarily to scale, and some features may be exaggerated, minimized or omitted to emphasize details of particular components. Therefore, specific structural and functional details described herein are not to be interpreted as limiting, but merely as a representative basis for teaching one skilled in the art to variously employ the invention. The invention comprehends various aspects of electric motor torque error estimation and its various applications.

Systems and methods of the invention can be practiced to estimate torque accuracy in electric machine systems. Although discussed below in the context of electrified vehicles, it is contemplated that the invention can also be used for non-vehicular applications. The invention can be used in the design and implementation of electric drive systems, particularly in aspects of torque control. Methods of the invention can be practiced to achieve a desired torque accuracy in a cost-effective manner. Torque accuracy can be defined by the ratio of torque deviation to maximum torque, as expressed by Eqn. 1 below:

$$TorqueAccuracy[\%] = \frac{\tau_{real} - \tau_{cmd}}{\tau_{max}} \cdot 100\% \qquad (1)$$

where $\tau_{cmd}$, $\tau_{real}$ and $\tau_{max}$ represent the command torque, the developed shaft torque, and the maximum torque, respectively. Thus, torque accuracy can be expressed in terms of torque error (deviation between command torque and actual torque) and maximum torque output. The present invention can be employed to determine the effects of sensor error on torque error, which can also be addressed in terms of sensor accuracy and torque accuracy.

Figure 1:
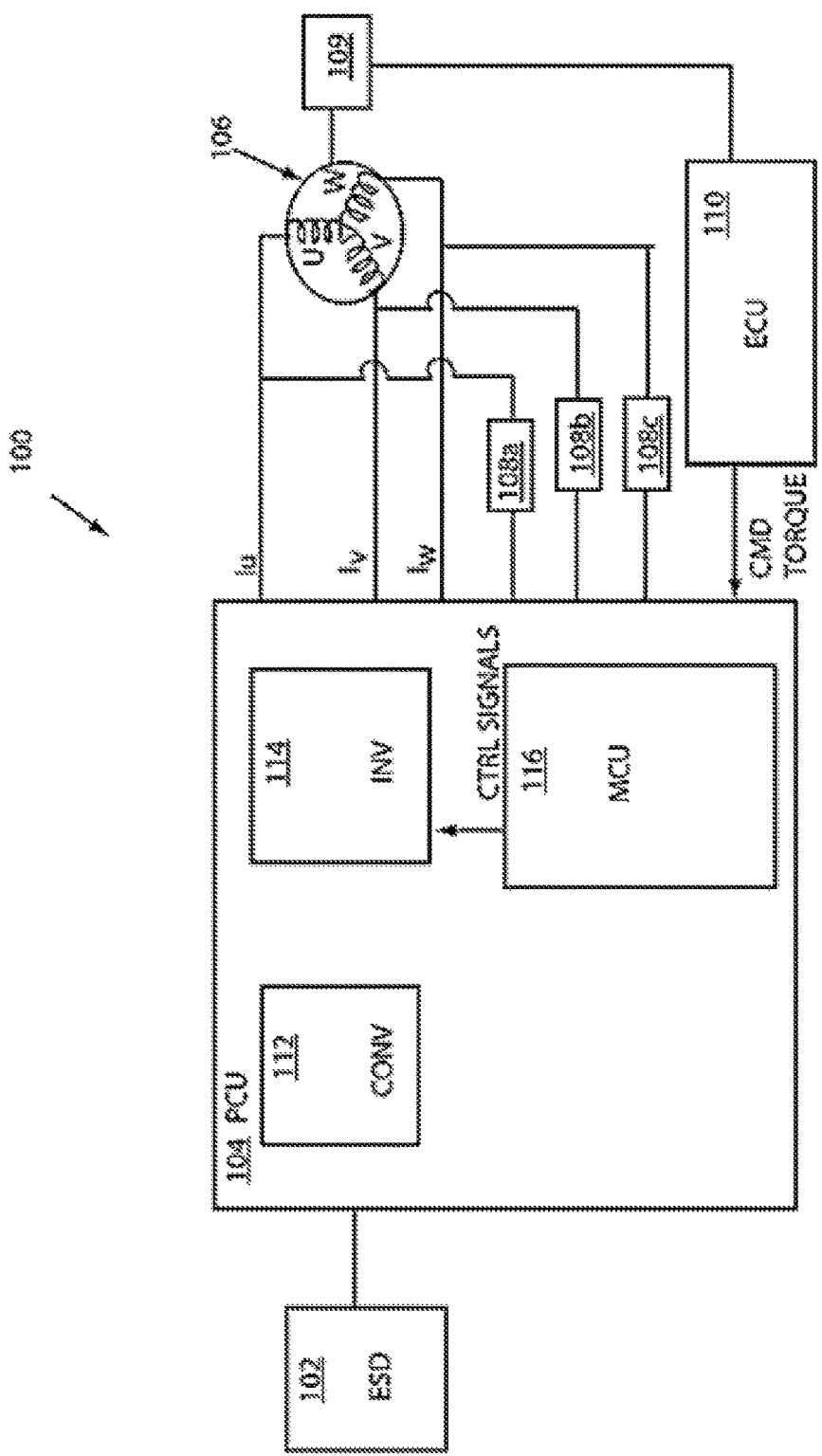
FIG. 1 shows an example environment in which sensor and torque errors can occur.

Turning now to the Drawings, in which like reference numerals refer to like elements throughout the several views, FIG. 1 shows an example environment in which sensing errors can affect torque accuracy. The system 100 includes components typically included in an electric drive system for an electric or hybrid electric vehicle, for example, an energy storage device (ESD) 102, a power control unit (PCU) 104, an electric machine (EM) 106 and one or more current sensors, depicted herein as sensors 108a, 108b, 108c, configured to provide current feedback to the PCU 104. In addition to the current sensors 108a, 108b, 108c, a resolver 109 can be configured to detect the rotational angle of the EM 106 and provide it to the PCU 104. An electronic control unit (ECU) 110 can be configured to receive output from other sensors (not shown), such as accelerator opening and wheel speed, and provide operation commands to the PCU 104 so that desired driving power and electric power can be generated.

By way of illustration, the ESD 102 can be in the form of a high voltage battery configured to provide a DC voltage. For example, the high voltage battery can be embodied as a nickel metal hydride battery, a lithium-ion battery or the like. The PCU 104 can be configured to receive DC energy from the ESD 102 and provide alternating current to drive the EM 106. The EM 106 can be configured to operate as a motor, converting electrical energy to mechanical energy that can be provided to a power transfer system (not shown) at the vehicle to drive the vehicle. It is also contemplated that the EM 106 can operate as a generator, converting mechanical energy to electrical energy that can be used to recharge the ESD 102. While shown with a single EM 106 in FIG. 1, it is further understood that an example system can include two EMs, with a first EM configured to operate as a motor, and a second EM configured to operate as a generator. By way of example, the EM 106 can be embodied as an interior permanent magnet synchronous motor IPMSM having three stator coils (not shown) and a rotating rotor (not shown).

By way of example, but not limitation, the PCU 104 can include a voltage converter 112 configured to boost a DC voltage received from the ESD 102 and provide the boosted voltage to an inverter 114. It is contemplated that the voltage converter 112 can also be configured to convert high voltage energy at the inverter 114 to a lower voltage in order to recharge the ESD 102 during regenerative braking operations as known in the art. The inverter 114 can be configured to provide alternating current for a three-phase EM 106. By way of example, the inverter 114 can provide three separate phase currents Iu, Iv, Iw to the EM 106 through controlled operation of a plurality of switches arranged in three parallel phase legs (not shown). Each phase leg can be coupled to a separate U, V, or W coil of the EM 106.

A motor control unit (MCU) 116 can be configured to provide control signals to the inverter 114 to activate its switches in a manner that produces the phase currents required by the EM 106 to provide a desired torque output. In an example embodiment, a current sensor 108a can be configured to detect phase current Iu and a current sensor 108b can be configured to detect the phase current Iv. A third sensor 108c may also be included to sense the current Iw.

Figure 2:
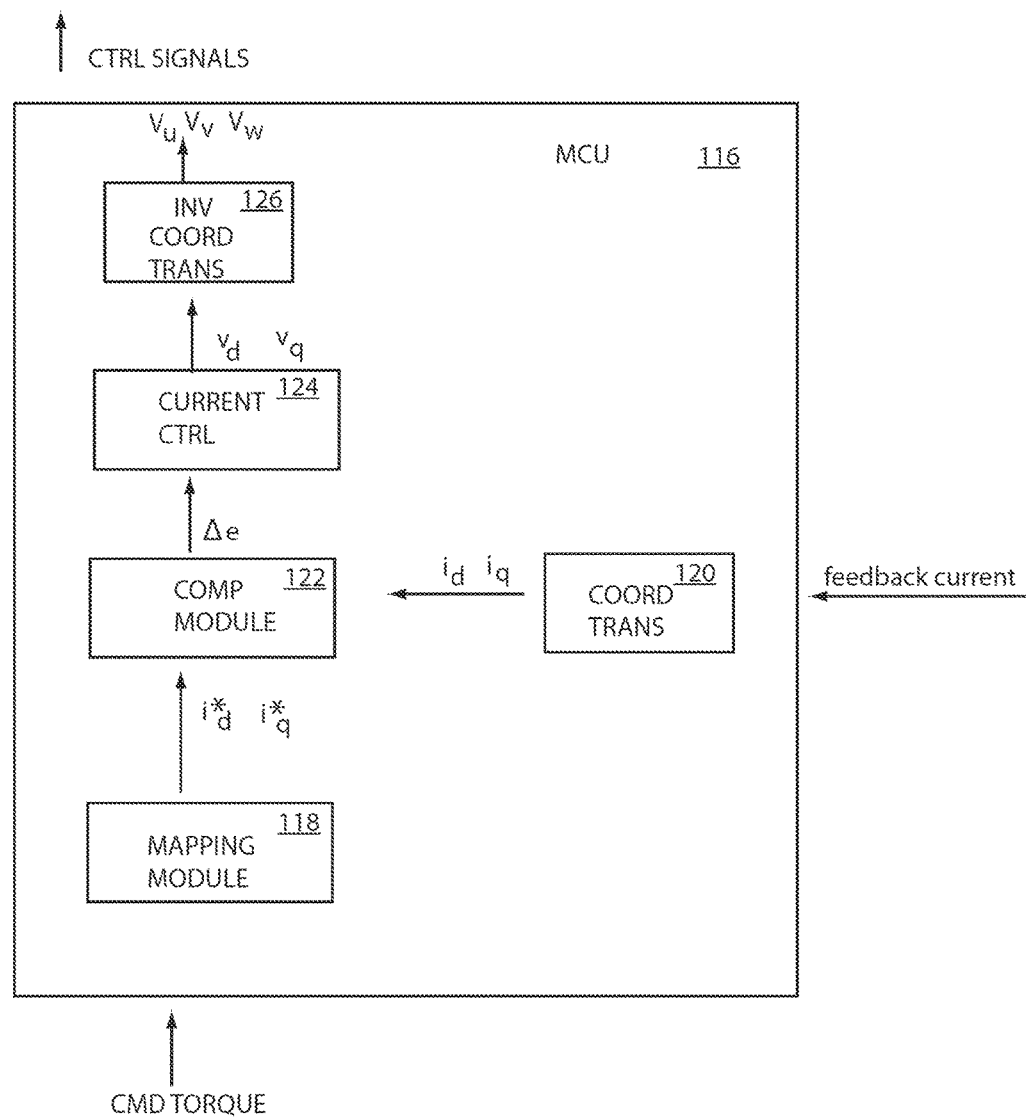
FIG. 2 shows an example environment in which sensor and torque errors can occur.

FIG. 2 shows an example MCU 116 configured to use current feedback and torque demand to provide control signals for the inverter 114. By way of example, the MCU 116 can be micro-processor based. Torque demand, also referred to as command torque, $\tau_{cmd}$, can be provided to the MCU 116 by the ECU 110. As known by those skilled in the art, various methods can be used to generate a command torque, but it is generally determined by vehicle operational state and desired vehicle speed. By way of example, a command torque can be determined based on the difference between a command rotational velocity, generated in response to a requested vehicle speed, and an actual rotational velocity as determined from resolver 109 output.

Given a command torque $\tau_{cmd}$, the MCU 116 can produce the drive signals necessary to achieve the desired torque. Again, this process can be practiced in different ways by those skilled in the art. By way of example, command torque can be provided to a mapping module 118 configured to map $\tau_{cmd}$ to command currents that are expected to produce the desired torque. Motor control is often performed using a current vector represented in a 2-dimensional d-q rotating frame of reference aligned with a motor rotor. For example a current Is can be expressed in terms of a component $I_d$ aligned with magnetic flux along a d-axis, and an orthogonal component $I_q$ along a q-axis in quadrature with the magnetic flux. The mapping module 118 can determine the command $I*_d$ and $I*_q$ components required by the EM 106 to provide an $I*_s$ that satisfies the command torque. By way of example, the mapping module 118 can comprise a look-up table in which predetermined values of $I*_d$ and $I*_q$ are associated with a particular output torque value.

In the system 100, feedback current is used to control torque output. A comparison module 122 can be configured to compare a command current $I*_s$ based on command torque, with feedback current from the EM 106. For example, feedback currents sampled by the sensors 108a, 108b, 108c can be received at the MCU 116. By way of example, the current sensors 108a, 108b, 108c can provide digitized values to the MCU 116. The feedback currents detected by the sensors 108a, 108b, 108c are with respect to a reference frame based on EM 106 stator windings rather than the rotating reference frame of the EM 106 rotor. Accordingly, they can be provided to a coordinate transformation module 120 in which Park and Clark transformations can be performed as known in the art to convert the feedback currents to d-q space for field-oriented motor control operations. At this point, inaccuracies caused by sensing errors at the current sensors 108a, 108b, 108c can come into play. Sensing errors at the sensors 108a, 108b, 108c can result in inaccurate feedback values for motor phase currents, which can in turn be transformed to inaccurate current vectors in d-q space.

Once the command and feedback currents are expressed in the same coordinate system, the comparison module 122 can be configured to determine the difference Δe between them. This difference can be provided to the current control module 124 which can be configured to provide a command voltage vector v* in d-q space that corresponds to Δe, as known in the art. At this point, current sensing errors at sensors 108a, 108b, 108c have been incorporated into the command voltage vector v* The coordinate transformation module 126 can then employ inverse Park and Clark transformations to convert the voltage vector v* to the stator windings reference frame to provide control signals Vu, Vv, Vw. In an example embodiment, the control signals Vu-Vw can be modulated to provide six individual drive signals for six switches of the inverter 112. Applying the drive signals at the inverter 112 cause it to produce phase currents for the EM 106.

The equations below can be helpful in modeling EM systems like the ones depicted in FIGS. 1 and 2 and described above. Eqn. 2 below is an equation that can be used to model EM operation:

$$\begin{bmatrix} \frac{di_q}{dt} \\ \frac{di_d}{dt} \end{bmatrix} = \begin{bmatrix} -\frac{R_s}{L_q} & -\frac{\omega_e L_d}{L_q} \\ \frac{\omega_e L_q}{L_d} & -\frac{R_s}{L_d} \end{bmatrix} \begin{bmatrix} i_q \\ i_d \end{bmatrix} + \begin{bmatrix} -\frac{1}{L_q} \\ 0 \end{bmatrix} \cdot \omega_e \lambda_m + \begin{bmatrix} \frac{1}{L_q} & 0 \\ 0 & \frac{1}{L_d} \end{bmatrix} \cdot \begin{bmatrix} v_q \\ v_d \end{bmatrix} \quad (2)$$

$i_d$ is the d-axis current
$i_q$ is the q-axis current
$R_s$ is the stator resistance
$\omega_e$ is the rotor angular velocity
$L_d$ is the d-axis inductance
$L_q$ is the q-axis inductance
$\lambda_m$ is flux of machine
$v_d$ is d-axis voltage
$v_q$ is q-axis voltage Eqn. 3 below is an equation that can be used in modeling the current control function for an EM system, such as a current control function performed by the current controller 124.

$$\begin{bmatrix} v_q^* \\ v_d^* \end{bmatrix} = \begin{bmatrix} k_{pq} \cdot I_q^* + k_{iq} \cdot \int_0^t I_q^* d\tau + k_{pd} \cdot \hat{\omega}_e \cdot \int_0^t I_d^* d\tau \\ k_{pd} \cdot I_d^* + k_{id} \cdot \int_0^t I_d^* d\tau - k_{pq} \cdot \hat{\omega}_e \cdot \int_0^t I_q^* d\tau \end{bmatrix} - \quad (3)$$

$$\begin{bmatrix} (k_{pq} + R_a) \cdot \hat{i}_q + k_{iq} \cdot \int_0^t \hat{i}_q d\tau + k_{pd} \cdot \hat{\omega}_e \cdot \int_0^t \hat{i}_d d\tau \\ (k_{pd} + R_a) \cdot \hat{i}_d + k_{id} \cdot \int_0^t \hat{i}_d d\tau - k_{pq} \cdot \hat{\omega}_e \cdot \int_0^t \hat{i}_q d\tau \end{bmatrix} + \begin{bmatrix} \omega_e \cdot \lambda_m \\ 0 \end{bmatrix}$$

$k_{pq}$ is a proportional coefficient
$k_{pd}$ is a proportional coefficient
$k_{iq}$ is an integration coefficient
$k_{id}$ is an integration coefficient
$I_q^*$ is command current
$I_d^*$ is command current
$R_a$ is active resistance
$\hat{i}_q$ is feedback current
$\hat{i}_d$ is feedback current When current feedback is used to control torque, the current sensor error effects are included in the determination of Δe and the determination of the voltage command signals. However, the question remains as to whether the sensor errors adversely affect torque output. Some degree of torque deviation can be tolerated without a significant effect on vehicle performance. Since accuracy directly correlates with cost, it would be helpful to determine the torque error caused by current sensor error so that a reasonable balance can be struck between accuracy and cost.

Figure 3A:
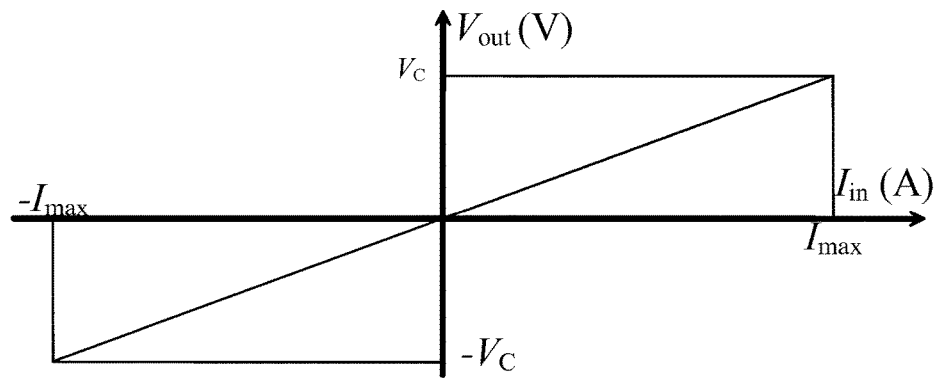
FIG. 3A shows an example of nominal sensor output.
Figure 3B:
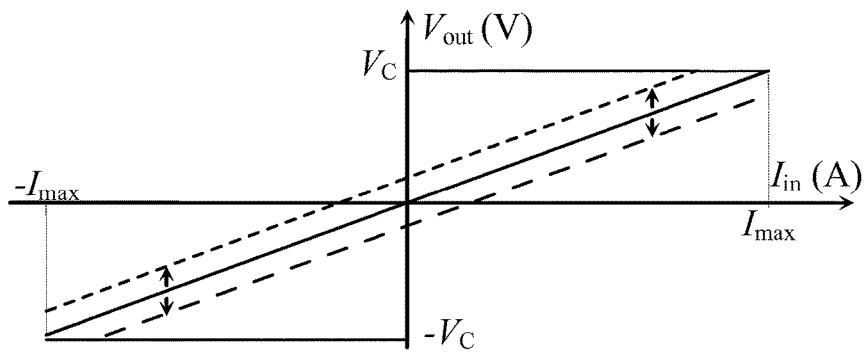
FIG. 3B shows an example of sensor output affected by gain error.
Figure 3C:
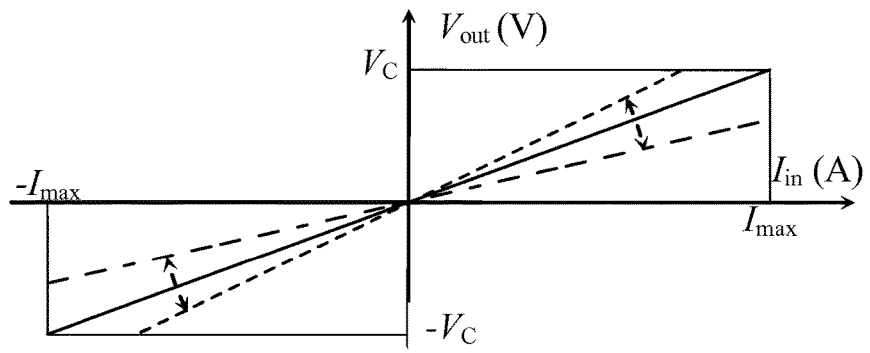
FIG. 3C shows an example of sensor output affected by offset error.

Two primary characteristics of a current sensor that can affect its accuracy are its gain and its offset error. FIGS. 3A-3C illustrate the effects of gain errors and offset errors on sensor output. FIG. 3A shows a plot of a nominal current sensor that has no gain or offset errors. In this case, when the input current Iin is zero, the output voltage Vout is also zero, indicating that the offset error is zero. Furthermore, input current ranging from −Imax to +Imax produces output voltages ranges from −Vc to +Vc, indicating that the sensor gain is equal to 1. FIG. 3B depicts examples of sensor offset errors, while FIG. 3C depicts examples of sensor gain errors. As discussed below, an example embodiment of the invention can demonstrate the effects of both sensor gain and offset on the torque accuracy of an electric drive system.

Figure 4:
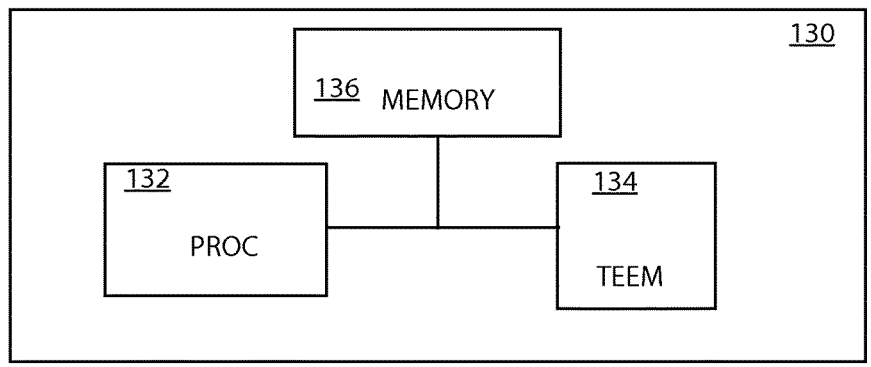
FIG. 4 shows an example system for torque error determination.
Figure 5:
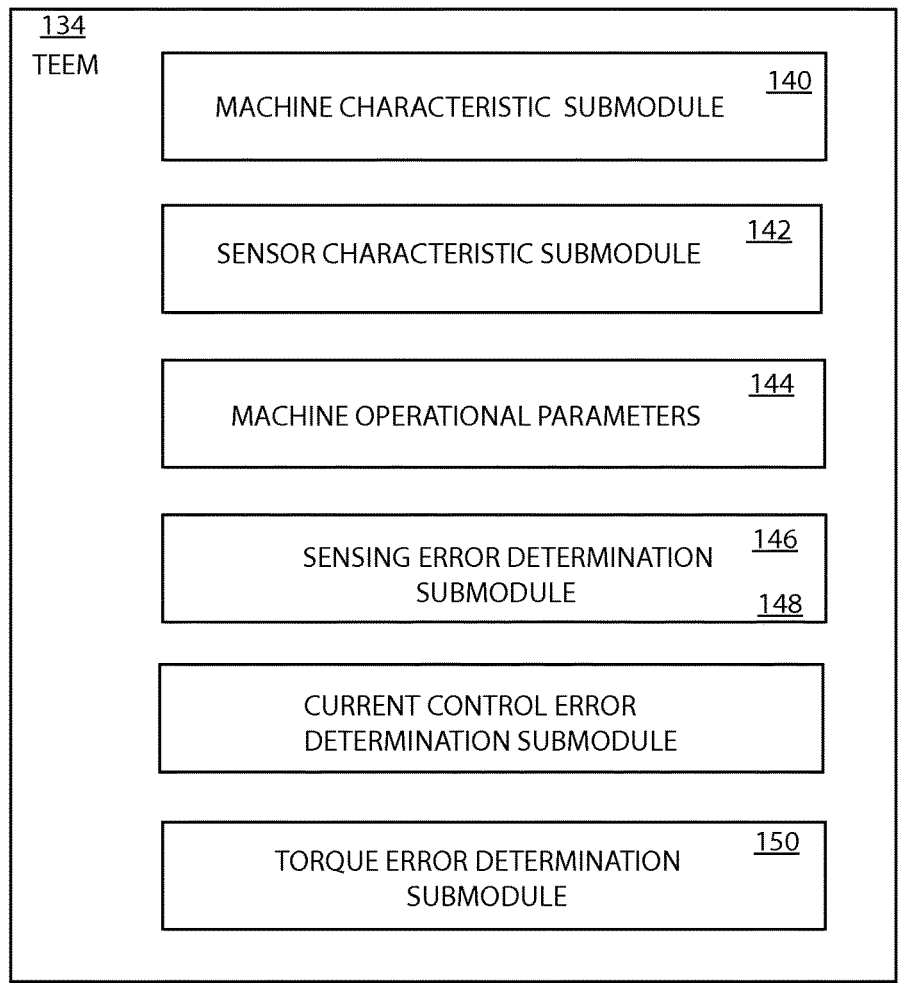
FIG. 5 shows an example apparatus for torque error determination.

FIG. 4 shows an example system 130 for estimating torque error caused by current sensing error. The system 130 can include a processor 132, a torque error estimation module (TEEM) 134 and a memory 136. The processor 132 can be in the form of a computer, a micro-computer, a multi-purpose microprocessor, a dedicated micro-processor or any apparatus configured to read and execute encoded logic and perform the required processing functions. The TEEM 134 can comprise hardware, software, firmware or some combination thereof, and can be configured to cooperate with the processor 132 to provide an estimated torque error. In an example embodiment, the TEEM 134 comprises a non-transitory medium in which logic instructions executable by the processor 132 are stored. The instructions can cause the processor to use current sensor characteristics and machine characteristics in a torque error estimation. It is contemplated that the TEEM 134 can reside at, and be integrated with, the processor 132, for example as recorded in a read-only memory of a computer. Alternatively, the TEEM 134 can be in the form of a removable storage medium on which logic is recorded.

The memory 136 can be configured to store various parameters and characteristics associated with sensor and machine operation. By way of example, but not limitation, the memory 136 can be configured to store data such as command currents values associated with various torque outputs; various current sensor characteristics such as gains and offsets, and/or other parameters and characteristics associated with EM operation and control. For example, the memory 136 can comprise a structured database, read-only memory, or a combination of read-only memory and random access memory. While depicted for illustrative purposes as a separate entity in FIG. 3, it is understood that the memory 136 can also be integrated with the processor 132 or the TEEM 134.

By way of example, the processor 132 can be in the form of a computer configured to execute the TEEM 134 as encoded logic stored on its hard drive. Operational data and apparatus parameters can be stored at the memory 136 and retrieved as necessary to perform a method of the invention. In an alternative embodiment, the processor 132 can be in the form of a processor at an electric vehicle, such as a processor at the MCU or at the vehicle ECU. The processor 132 can be configured to receive operational data and/or apparatus parameters from the memory 136, the MCU 114, a vehicle ECU or other sensor or module at a vehicle. For example, the processor 132 can be configured to communicate with other modules and devices onboard a vehicle through a vehicle controller-area-network (CAN). In an example embodiment, the TEEM 134 can be configured to cooperate with other modules involved in a torque error determination process, so that a cumulative torque error can be determined at a vehicle. By way of example, a torque error can be used in an error compensation system configured to adjust torque output at a vehicle.

FIG. 4 shows an example embodiment of the TEEM 134. In the example depicted in FIG. 4, the TEEM 134 includes a machine characteristic submodule (MCS) 140, sensor parameter submodule (SPS) 142, a machine operational parameter submodule (MOPS) 144, a sensing error determination submodule (SEDS) 146, a current control error determination module (CCEDS) 148 and a torque error determination module (TEDS) 150. In an example embodiment, the MPS140 can be configured to receive machine characteristics provided as user input by an operator. For example, a user interface displayed at a display screen or monitor coupled with the processor 132 can be configured to prompt an operator to provide one or more machine characteristics. An interactive interface and touch screen display, a keypad or keyboard, or alternative means of receiving user input as known in the art can be employed. This allows torque control error estimation to be customized for a particular machine. In an example embodiment, characteristics such as $L_d$, $L_q$, P, and $\lambda m$, can be received from an operator. Alternatively, machine parameters can be stored at the memory 136, and retrieved for the MPS 142. For example, characteristics can be stored in association with a particular identified machine.

The SPS 142 can be configured to determine one or more sensor characteristics. By way of example, the SPS 12 can be configured to receive or determine gain and offset values for the sensors 108a and 108b By way of example, but not limitation, a range of gain. values and offset values can be stored at the memory 136. For example, empirical data derived from sensor testing, ranges of values corresponding to sensor types or accuracy grades, ranges of average values, etc. can be stored at the memory 136, and individual values selected. In an example embodiment, gain can range from 0.95 to 1.05. An offset can vary with the type of sensor. For example, for a current sensors with a 5V single polarity power supply, the offset can range from −100 mV to 100 mV.

In an example embodiment, the MOPS 144 can be configured to receive, determine, select or retrieve machine operational parameters such as operational current (Is) and current angle γ. In an example embodiment, one or more values or ranges of values for these parameters can be stored at the memory 136, retrieved by the processor 132 and received at the MPS 140. In an alternative embodiment, when the invention is practiced onboard a vehicle, these parameters can be received from sensors coupled to a EM, from a vehicle ECU, or from another onboard source.

The SEDS 146 can be configured to determine a sensing error associated with one or more current sensors. In an example embodiment, the SEDS 146 can be configured to determine sensing errors using Eqns. 4 and 5 below:

$$\begin{bmatrix} \delta \hat{i}_q \\ \delta \hat{i}_d \end{bmatrix} = \delta \hat{I}^- \cdot \begin{bmatrix} \sin(2\theta_e + \gamma + \frac{\pi}{3}) \\ -\cos(2\theta_e + \gamma + \frac{\pi}{3}) \end{bmatrix} + \quad (4)$$

$$\delta \hat{I}^0 \cdot \begin{bmatrix} \sin(\theta_e + \beta) \\ -\cos(\theta_e + \beta) \end{bmatrix} + \delta \hat{I}^+ \cdot \begin{bmatrix} -\sin(\gamma - \alpha) \\ -\cos(\gamma - \alpha) \end{bmatrix}$$

$$\delta \hat{I}^- = \frac{(k_a - k_b)}{\sqrt{3}} \cdot I_s \quad (5)$$

$$\delta \hat{I}^0 = \sqrt{I_{a\_off}^2 + \left(\frac{1}{\sqrt{3}} I_{a\_off} + \frac{2}{\sqrt{3}} I_{b\_off}\right)^2}$$

$$\delta \hat{I}^+ = \sqrt{\left(\frac{k_a - k_b}{2\sqrt{3}}\right)^2 + \left(\frac{k_a + k_b - 2}{2}\right)^2} \cdot I_s$$

$$\alpha = \tan^{-1} \frac{\sqrt{3}(k_a + k_b - 2)}{(k_a - k_b)}, \beta = \tan^{-1} \frac{\sqrt{3} I_{a\_off}}{I_{a\_off} + 2 I_{b\_off}}$$

$k_a$ is gain of sensor 108a
$k_b$ is gain of sensor 108b
$I_{a\_off}$ is offset of sensor 108a
$I_{b\_off}$ is offset of sensor 108b As can be seen from the above expressions, offset characteristics can generally affect the DC component of sensing error, a significant factor at all operational states, while gain characteristics can generally affect the positive and negative sequences of the current sensing error, factors that are more significant at lower speeds.

In an example embodiment, the CCEDS 148 can be configured to use SEDS 146 output to determine current control errors caused by current sensing errors. In an example embodiment, the CCEDS 148 can be configured to determine current control errors using Eqns. 6 and 7 below:

$$\begin{bmatrix} \delta i_q \\ \delta i_d \end{bmatrix} = \delta I^+ \cdot \begin{bmatrix} \sin(\gamma - \alpha) \\ \cos(\gamma - \alpha) \end{bmatrix} + \quad (6)$$

$$\delta I^- \cdot \begin{bmatrix} -\sin(2\theta_e + \gamma + \phi) \\ \cos(2\theta_e + \gamma + \phi) \end{bmatrix} + \delta I^0 \cdot \begin{bmatrix} -\sin(\theta_e + \beta + \varphi) \\ \cos(\theta_e + \beta + \varphi) \end{bmatrix}$$

$$\delta I^+ = \delta \hat{I}^+ \quad (7)$$

$$\delta I^- = \delta \hat{I}^- \cdot \left(\sqrt{1 + \left(\frac{2\omega_e}{\omega_b}\right)^2}\right)^{-1}, \phi = \frac{\pi}{3} - \tan^{-1}\left(\frac{2\omega_e}{\omega_b}\right)$$

$$\delta I^0 = \delta \hat{I}^0 \cdot \left(\sqrt{1 + \left(\frac{\omega_e}{\omega_b}\right)^2}\right)^{-1}, \varphi = -\tan^{-1}\left(\frac{\omega_e}{\omega_b}\right)$$

γ is machine current angle
θ is angular position of rotor d-axis
$\omega_b$ is current controller bandwidth As seen from the above analytical expressions, current control errors can depend on sensor characteristics such as gain and offset, but can also vary according to machine operational parameters such as machine current, rotational speed, and angular position.

In an example TEEM, the TEDS 150 can be configured to use current control error determinations by the CCEDS 148 to determine the effects of sensor gain and offset characteristics on torque control errors. By way of example, the TEDS 150 can be configured to use the following expression in its torque error determination:

$$\delta\tau_e = \delta\tau_{e\_DC} + \delta\tau_{e\_\theta_e} + \delta\tau_{e\_2\theta_e} \quad (8)$$

As shown by (8), a torque control error estimate can include three components, a DC component, and $1^{st}$-order and $2^{nd}$-order ripple components. The TEDS 150 can be configured to estimate the DC component by:

$$\delta\tau_{e\_DC} = \frac{3P}{2}[\lambda_m + (L_d - L_q) \cdot \bar{i}_d] \cdot \delta I^+ \cdot \sin(\gamma - \alpha) + \quad (9)$$
$$\frac{3P}{2}(L_d - L_q) \cdot [\bar{i}_q \cdot \cos(\gamma - \alpha) + \delta I^+ \cdot \sin(\gamma - \alpha)\cos(\gamma - \alpha)] \cdot \delta I^+$$

The TEDS 150 can be configured to determine the amplitude of the first-order and second-order ripple by using the following expressions:

$$\delta\tau_{e\_\theta_e} = -\frac{3P}{2}[\lambda_m + (L_d - L_q) \cdot \bar{i}_d] \cdot \delta I^0 \cdot \sin(\theta_e + \beta + \varphi) + \frac{3P}{2} \quad (10)$$
$$(L_d - L_q) \cdot [\bar{i}_q \cdot \cos(\theta_e + \beta + \varphi) - \delta I^+ \sin(\theta_e + \beta + \varphi - \gamma + \alpha)] \cdot \delta I^0$$

$$\delta\tau_{e\_2\theta_e} = -\frac{3P}{2}[\lambda_m + (L_d - L_q) \cdot \bar{i}_d] \cdot \delta I^- \cdot \sin(2\theta_e + \gamma + \phi) + \quad (11)$$
$$\frac{3P}{2}(L_d - L_q) \cdot [\bar{i}_q \cdot \cos(2\theta_e + \gamma + \phi) - \delta I^+ \sin(2\theta_e + \alpha + \phi)] \cdot \delta I^- -$$
$$\frac{3P}{2}[(L_d - L_q)\sin2(\theta_e + \beta + 2\varphi)] \cdot (\delta I^0)^2$$

Figure 6:
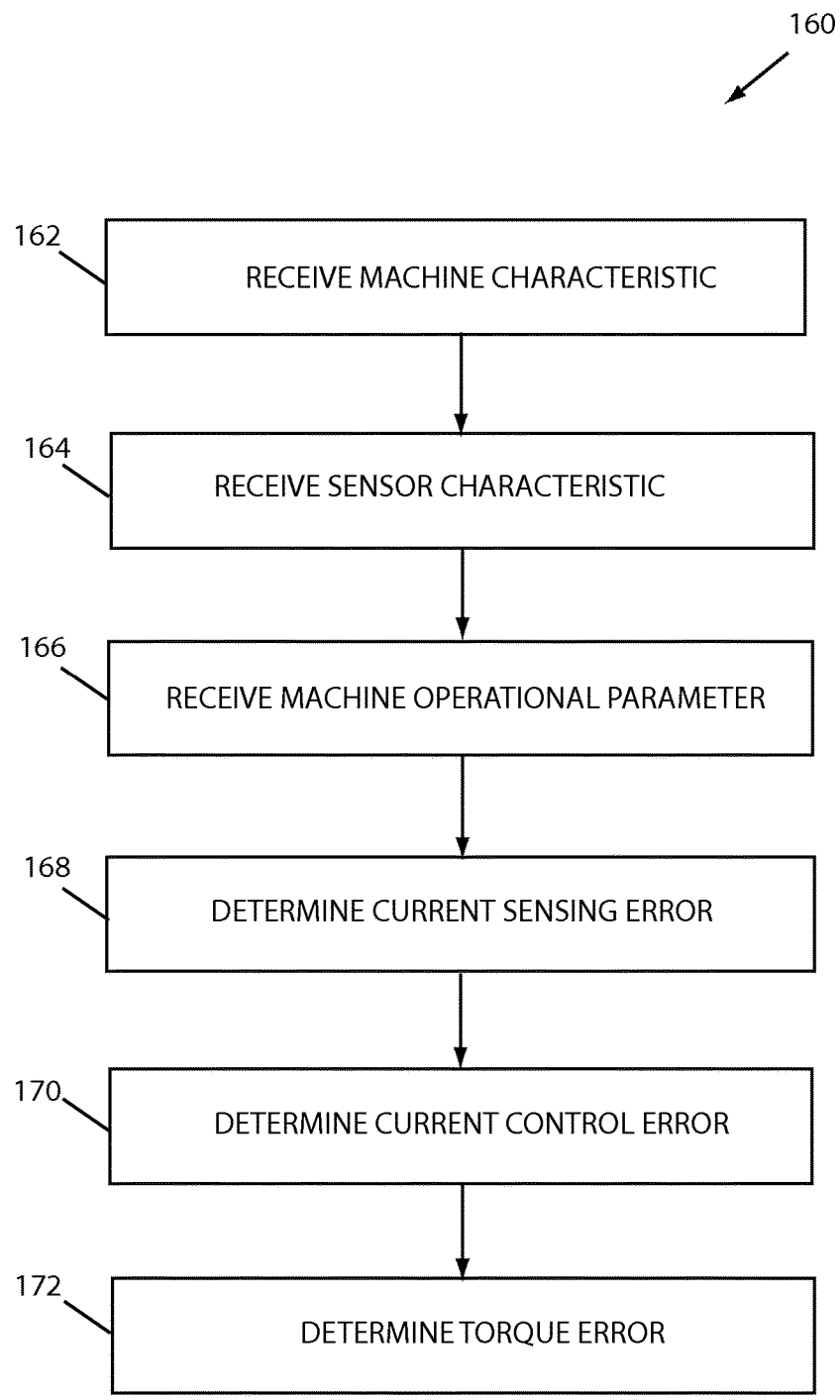
FIG. 6 shows an example method for torque error determination.

FIG. 6 shows an example method 160 of the invention. At block 162 machine characteristics can be received at the MCS 140. For example, an operator can provide characteristics of the EM 106, such as $L_d$, $L_q$, P and $\lambda_m$ as user input to the TEEM 134 via a user interface screen and/or user input device. By way of further example, predetermined characteristics associated with a particular EM can be stored and retrieved during the process 160. For example, the MCS 140 can include instructions that can be read and executed by the processor 132 to retrieve one or more machine characteristics from the memory 136.

At block 164 sensor characteristics such as sensor gain and offset can be received. In an example embodiment, a range of predetermined values for sensor gain and offset can be stored at the memory 136, retrieved by the processor 132 and received at the SPS 142. Various strategies can be employed for retrieving gain and offset error values for one or more current sensors. In an example embodiment random values within a predetermined range can be selected over multiple iterations of the method 160 to provide an output that representing a torque error estimate.

At block 166 machine operational parameters can be received. In an example embodiment operational parameters can include machine current Is and machine current angle γ. By way of example, various values of Is and γ associated with various EM 106 operating conditions can be stored at the memory 136 and provided to the MOPS 144 by the processor 132. Various strategies can be practiced in retrieval of the machine parameters. As a further example, when a method of the invention is practiced onboard a vehicle, sensors at the EM 106 can be configured to acquire the machine operational parameters, which can then be provided to the MOPS 146.

At block 168 sensing errors can be determined. For example, the SEDS 146 can determine the sensing errors associated with first and second current sensors 108a and 108b by using Eqns. 4 and 5 and the values for various parameters and characteristics received at blocks 162-166. At block 170, current control errors can be determined. For example, the CCEDS 148 can use output from the SEDS 146 and the Eqns. 6 and 7 to determine current control errors expressed in d-q space.

At block 172, torque control error can be estimated. In an example embodiment, the TEDS 150 can use output from the CCEDS 148 and the Eqns. 8-11 to determine an estimated torque control error. In an example embodiment, a torque control error estimate can be provided as output. By way of example, the torque error output can be provided to an operator, for example at a display device coupled to the processor 132. By way of further example, torque error due to sensor error can be provided, either alone or as a component to a cumulative torque error, to a diagnostics module at a vehicle which can be configured to display an error code when the torque error estimate exceeds a predetermined threshold. It is further contemplated that torque control error output can be used for torque compensation at a vehicle. An example embodiment can further include determining a torque accuracy by using the torque error determined by the TEDS 150, Eqn. 1 and the maximum torque characteristic of an electric machine.

By way of example, an operator can use an estimated torque control error to determine the optimal type and/or accuracy of current sensor for a particular motor control application. Optimizing sensor selection allows design and implementation of vehicle electric drive systems that are both well-performing and economical. The invention can provide a measure for evaluating and characterizing the relationship between sensor accuracy and torque accuracy, and between sensor accuracy and electric drive performance. By way of example, curves of torque control error versus gain can be generated so that a maximum tolerable gain error for a desired torque control error or torque accuracy can be readily identified. Similarly, plots of torque control error as a function of offset error can be generated. The invention can enable the determination of a minimum required sensor accuracy for a desired torque accuracy so that unnecessary deployment of high cost sensors can be avoided. The invention can also provide torque error compensation at a vehicle, and/or torque error input to an onboard diagnostics module. In addition, results provided by the invention can be used to assist efforts to decrease the number of current sensors from 3 to 2, further reducing the cost of a high-performing electric drive system.

Original analytical expressions have been derived and presented for isolating and determining current sensing error, current control error and torque control error. Equations are presented that express the various types of errors in terms of current sensor characteristics such as gain and offset. Methods and apparatus of the invention can be configured to implement the equations and analytical expressions to estimate a current sensing error, current control error and torque control error due to a current sensor characteristic, so that the effects of sensor characteristics on these errors are readily observed and identifiable. Isolating a torque control error due to sensor error from a general torque error that can be caused by a plurality of factors enables the determination of optimal current sensor characteristics for electrical machine applications. The expression of current sensing error, current control error and torque control error in terms of current sensor characteristics such as gain and offset, and using those equations in determination of those errors provides many advantages and benefits unseen in the prior art.

Various embodiments have been disclosed herein for illustrative purposes. Those skilled in the art will appreciate that various modification, additions and subtractions are possible without departing from the spirit of the invention as described in the appended claims.

We claim:

1. An electric drive system comprising:
an electric machine;
a current sensor; a torque-control processor generating control signals for an inverter connected to the electric machine based on a torque estimate calculated from a sensed current; and
a torque error estimation module estimating an accuracy error in the torque estimate due to a gain or offset error of the sensor;
wherein the processor adjusts the control signals in response to the accuracy error,
wherein the torque error estimation module comprises:
a machine characteristics submodule (MCS) configured to receive at least one electric machine characteristic of the electric machine;
a sensor parameter submodule (SPS) configured to receive at least one error characteristic of the current sensor; and
a torque accuracy error determination submodule (TEDS) configured to estimate an accuracy error in torque control determined in response to the machine characteristic and the error characteristic, wherein estimating said torque accuracy error comprises estimating a first-order ripple component of said torque accuracy error;
wherein the torque error estimation module provides the accuracy error to the processor.

2. The system of claim 1, wherein said torque error estimation module is configured to access stored electric machine characteristic data and sensor characteristic data and to receive machine operational parameters including the sensed current.

3. The system of claim 1, wherein the torque error estimation module further comprises a machine operational parameter submodule (MOPS) configured to receive at least one operational parameter of said electric machine.

4. The system of claim 1, wherein the torque error estimation module further comprises a sensing error determination submodule (SEDS) configured to determine an error in current sensing caused by said at least one error characteristic of said sensor.

5. The system of claim 1, wherein the torque error estimation module further comprises a current control error determination submodule (CCEDS) configured to determine an accuracy error in current control due to said error characteristic of said sensor.

6. The system of claim 1 wherein the processor adjusts the control signals to compensate for the accuracy error.

7. The system of claim 1 wherein the processor includes an onboard diagnostics module to compare the accuracy error with a predetermined threshold.

8. A method for controlling torque of an electric machine, comprising:
receiving at a torque error estimation module (TEEM) at least one sensor error characteristic of a sensor configured to sense phase current between said electric machine configured for current feedback control and an inverter, said TEEM comprising a machine characteristics submodule (MCS) configured to receive at least one machine characteristic of said electric machine, a sensor parameter submodule (SPS) configured to receive said at least one sensor error characteristic, and a torque accuracy error determination submodule (TEDS) configured to estimate an accuracy error in torque control caused by said at least one sensor error characteristic, wherein estimating said torque accuracy error comprises estimating a first-order ripple component of said torque accuracy error;
sensing said phase current to determine a torque generated by said electric machine;
comparing said determined torque to a desired torque output to determine control signals according to said current feedback control; and
adjusting said control signals within the current feedback control in response to said torque accuracy error.

9. The method of claim 8, further comprising said TEEM determining a current sensing error caused by said at least one sensor error characteristic of said sensor.

10. The method of claim 8, further comprising said TEEM determining a current control error caused by said at least one sensor error characteristic of said sensor.

11. The method of claim 8, wherein said at least one sensor error characteristic of said sensor comprises a gain or an offset characteristic.

12. The method of claim 8, further comprising said TEEM receiving an operational parameter associated with said electric machine.

13. The method of claim 8, wherein said operational parameter comprises said sensed phase current.

14. The method of claim 8, wherein said determining torque accuracy error comprises determining a dc torque deviation.

15. The method of claim 8, wherein said estimating said torque accuracy error comprises estimating a second-order ripple component of said torque accuracy error.

* * * * *